(12) United States Patent
Kirihara et al.

(10) Patent No.: US 9,496,474 B2
(45) Date of Patent: Nov. 15, 2016

(54) THERMOELECTRIC CONVERSION APPARATUS

(75) Inventors: Akihiro Kirihara, Tokyo (JP);
Hiroyuki Endoh, Tokyo (JP);
(Continued)

(73) Assignees: NEC CORPORATION, Tokyo (JP);
TOHOKU UNIVERSITY, Sendai-Shi, Miyagi (JP)

(*) Notice: Subject to any disclaimer, the term of this patent is extended or adjusted under 35 U.S.C. 154(b) by 250 days.

(21) Appl. No.: 14/124,656

(22) PCT Filed: May 22, 2012

(86) PCT No.: PCT/JP2012/063575
§ 371 (c)(1),
(2), (4) Date: Dec. 6, 2013

(87) PCT Pub. No.: WO2012/169377
PCT Pub. Date: Dec. 13, 2012

(65) Prior Publication Data
US 2014/0102501 A1    Apr. 17, 2014

(30) Foreign Application Priority Data
Jun. 9, 2011   (JP) ................. 2011-129308

(51) Int. Cl.
*H01L 35/30*   (2006.01)
*H01L 35/02*   (2006.01)
(Continued)

(52) U.S. Cl.
CPC ............... *H01L 35/02* (2013.01); *H01L 35/34* (2013.01); *H01L 37/00* (2013.01); *H01L 43/02* (2013.01)

(58) Field of Classification Search
CPC ....................................................... H01L 37/00
(Continued)

(56) References Cited

U.S. PATENT DOCUMENTS 6,700,052 B2* 3/2004 Bell ................... H01L 35/32
136/201
8,203,191 B2  6/2012 Uchida et al.
8,254,163 B2  8/2012 Kajiwara et al.
(Continued)

FOREIGN PATENT DOCUMENTS

CN    101681976 A    3/2010
JP    2003-282970 A   10/2003
(Continued)

OTHER PUBLICATIONS

Akhter et al., "Thickness and grain-size dependence of the coercivity in permalloy thin films," J. Appl. Phys. 81, 4122 (1997); http://dx.doi.org/10.1063/1.365100.*
(Continued)

*Primary Examiner* — Luan Van
*Assistant Examiner* — Angelo Trivisonno
(74) *Attorney, Agent, or Firm* — McGinn IP Law Group, PLLC

(57) ABSTRACT

A thermoelectric conversion apparatus has a substrate and a power generation part. The power generation part has a magnetic layer with magnetization and an electrode layer made of a material exhibiting a spin-orbit interaction and formed on the magnetic layer. The substrate and the power generation part have flexibility. This thermoelectric conversion apparatus further has a cover layer having flexibility and formed on the substrate so as to cover at least the power generation part.

9 Claims, 10 Drawing Sheets

(75) Inventors: Takashi Manako, Tokyo (JP); Kenichi Uchida, Sendai (JP); Eiji Saitoh, Sendai (JP)

(51) Int. Cl.
*H01L 37/00* (2006.01)
*H01L 35/34* (2006.01)
*H01L 43/02* (2006.01)
*H01L 21/00* (2006.01)

(58) Field of Classification Search
USPC ........................................................ 136/205
See application file for complete search history.

(56) References Cited

U.S. PATENT DOCUMENTS

| | | | |
|---|---|---|---|
| 2002/0179135 A1* | 12/2002 | Shutoh | H01L 35/20 136/200 |
| 2005/0205893 A1 | 9/2005 | Makita et al. | |
| 2010/0170550 A1 | 7/2010 | Hiroyama | |
| 2010/0276770 A1* | 11/2010 | Uchida | G01K 7/36 257/421 |
| 2011/0075476 A1 | 3/2011 | Kajiwara et al. | |
| 2011/0084349 A1 | 4/2011 | Uchida et al. | |

FOREIGN PATENT DOCUMENTS

| | | | |
|---|---|---|---|
| JP | 2004-104041 A | 4/2004 | |
| JP | 2006-269721 A | 10/2006 | |
| JP | 2009-130070 A | 6/2009 | |
| JP | 2009-295824 A | 12/2009 | |
| JP | 2010-199276 A | 9/2010 | |
| WO | WO 2009066631 A1 * | 5/2009 | ............... G01K 7/36 |
| WO | WO 2009/151000 A1 | 12/2009 | |

OTHER PUBLICATIONS

International Search Report in PCT/JP2012/063575 dated Aug. 28, 2012 (English Translation Thereof).
K.Uchida et al., "Spin Seebeck Insulator", 2010, Nature Materials 9, p. 894-897.
K.Uchida et al., "Observation of Longitudinal Spin-Seebeck Effect in Magnetic Insulators", 2010, Appl. Phys. Lett.97, 172505.
T. Schneider et al., "Spin-Wave Tunneling through a Mechanical Gap", 2010, Europhysics Letters 90, 27003.
Extended European Search Report dated Nov. 6, 2014.

* cited by examiner

THERMOELECTRIC CONVERSION APPARATUS

TECHNICAL FIELD

The present invention relates to an apparatus for converting thermal energy into electric energy.

BACKGROUND ART

While efforts have actively been made toward environmental issues and energy issues, expectations of thermoelectric conversion technology have grown under such circumstances. Because heat is the most common energy source that is available from various situations, such as body heat, solar heat, engines, and industrial exhaust heat, thermoelectric conversion is expected to become more important in future for efficiency enhancement in energy use for a low-carbon economy or for applications of power supply to ubiquitous terminals, sensors, or the like.

A wide variety of heat sources, such as body heat of humans or animals, lighting (fluorescent lamps and street lamps), IT equipment (display server), automobiles (peripheral area of engine and exhaust pipe), public facilities (waste incinerators and water service pipes), buildings (walls, windows, and floors), and natural structures (plants, rivers, and grounds), can be used for thermoelectric conversion apparatuses. In thermoelectric conversion, a device should be brought into intimate contact with such a heat source, and a generated temperature difference should be used efficiently. However, most of heat sources have curved surfaces or irregularities. Therefore, it is desirable for a thermoelectric conversion apparatus to have flexibility so that it can readily be provided on heat sources having various shapes.

However, a thermoelectric conversion apparatus generally has a complicated structure in which a large number of thermocouples having a p-n junction are arranged and connected to each other. Therefore, it has been difficult for a thermoelectric conversion apparatus to adopt a flexible structure in view of the reliability and the like.

As a known method of providing a flexible thermoelectric conversion apparatus, for example, JP-A 2004-104041 (Patent Literature 1) discloses a method of arranging a plurality of thermocouples with use of a flexible polymer sheet as a support member. Furthermore, JP-A 2003-282970 (Patent Literature 2) discloses a structure in which a plurality of thermoelectric conversion devices of a p-type element and an n-type element stacked via a thermal insulator and cross-linked to each other with an electrode are jointed on a substrate having a flexible polymer sheet. Moreover, JP-A 2010-199276 (Patent Literature 3) describes a method of forming a flexible thermoelectric conversion apparatus by patterning p-n junctions with a coating or printing method.

The aforementioned methods can implement a flexible thermoelectric conversion apparatus. Nevertheless, if even one junction or wire is broken in a structure having a large number of thermocouples being connected, the function of thermoelectric power generation is impaired. Accordingly, there are still problems in a highly reliable operation of a flexible device.

Furthermore, in recent years, there has been discovered the spin Seebeck effect, which generates currents of spin angular momentum (spin currents) when a temperature gradient is applied to a magnetic material. JP-A 2009-130070 (Patent Literature 4), JP-A 2009-295824 (Patent Literature 5), Nature Materials 9, 894 (2010) (Non-Patent Literature 1), and Appl. Phys. Lett. 97, 172505 (2010) (Non-Patent Literature 2) show a structure in which spin currents induced in a magnetic body by the spin Seebeck effect are derived as an electric current (electromotive force) by a metal electrode.

Major features of a thermoelectric conversion apparatus using such a spin Seebeck effect include the fact that a thermoelectric conversion apparatus can fundamentally be formed merely by a junction structure of a magnetic body and an electrode and the fact that no complicated thermocouple structure is needed. Therefore, such a thermoelectric conversion apparatus may remarkably reduce a probability of occurrence of deficiencies such as the aforementioned breakage as compared to a conventional thermoelectric conversion apparatus having a large number of thermocouple junctions. Thus, such a thermoelectric conversion apparatus is expected as a flexible thermoelectric conversion apparatus having high reliability.

However, even if a thermoelectric conversion apparatus uses the spin Seebeck effect to simplify a device structure like a thermoelectric conversion apparatus illustrated in Patent Literatures 4 and 5 and Non-Patent Literatures 1 and 2, there is still room for improvement in producing a flexible device having high reliability. Specifically, the inventors' experiments have revealed the following. In a case of a structure in which a magnetic film and an electrode are deposited on a substrate, even if a flexible substrate is adopted, a high stress is applied to the magnetic film and the electrode when a device is bent. As a result, the thermoelectric conversion function may be impaired by breakage of the magnetic film or the electrode, separation of the junction portion of the magnetic film and the electrode, and the like.

Furthermore, the following has also been revealed. If the magnetic film or the electrode should be broken, such a high stress is applied directly to the magnetic film and the electrode, resulting in a large scattering loss of spin currents, for example, in a junction of the magnetic body and the electrode. Therefore, a thermoelectric power may be reduced.

DISCLOSURE OF INVENTION

It is, therefore, an object of the present invention to provide a flexible thermoelectric conversion apparatus having high reliability.

Another object of the present invention is to provide a method of manufacturing such a thermoelectric conversion apparatus.

According to the present invention, there is provided a thermoelectric conversion apparatus comprising a substrate and a power generation part formed on the substrate for generating a thermoelectric power, wherein the power generation part comprises a magnetic layer with magnetization and an electrode layer made of a material exhibiting a spin-orbit interaction and formed on the magnetic layer, the substrate and the power generation part having flexibility. The thermoelectric conversion apparatus further comprises a flexible cover layer formed on the substrate so as to cover at least the power generation part.

Furthermore, according to the present invention, there is provided a thermoelectric conversion apparatus further comprising a cylindrical member in a form of a pipe, wherein the substrate, the power generation part and the cover layer are arranged outside of the cylindrical member so that a magnetization direction of the magnetic layer of the power generation part is aligned with an axial direction of the cylindrical member, and the cylindrical member allows a heat source or a cold source to flow or remain inside thereof.

Moreover, according to the present invention, there is provided an electronic device comprising a flexible support member mounted on a heat source or a cold source, a signal generation device mounted on the support member, a wireless transmission device mounted on the support member, and the thermoelectric conversion apparatus. The signal generation device generates electric signal. The wireless transmission device transmits, as wireless signal, the electric signal generated by the signal generation device. The thermoelectric conversion apparatus applies the thermoelectric power as a power supply to one of the signal generation device and the wireless transmission device that needs supply of electric power.

BEST MODE FOR CARRYING OUT THE INVENTION

Figure 1:
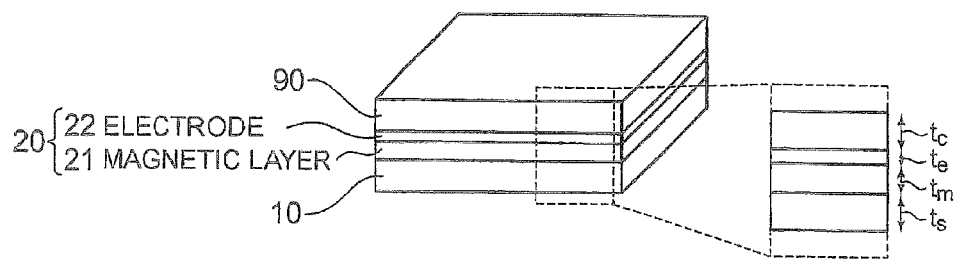
FIG. 1 is a perspective view showing a thermoelectric conversion apparatus according to a first embodiment of the present invention.

A thermoelectric conversion apparatus according to the present invention has a substrate and a power generation part formed on the substrate for generating a thermoelectric power. The power generation part includes a magnetic layer with magnetization and an electrode layer made of a material exhibiting a spin-orbit interaction and formed on the magnetic layer. The substrate and the power generation part have flexibility.

Particularly, the thermoelectric conversion apparatus according to the present invention further includes a cover layer having flexibility, and the cover layer is formed on the substrate so as to cover at least the power generation part.

Specifically, a thermoelectric conversion apparatus according to the present invention is characterized in that a power generation part, which includes at least one magnetic layer with magnetization and an electrode containing material exhibiting a spin-orbit interaction, is interposed between a substrate and a cover layer and that the substrate and the cover layer have flexibility. Preferably, the thickness of the cover layer is at the same level of the thickness of the substrate and, specifically, is in a range of 60 to 150% of the thickness of the substrate.

A thermoelectric conversion apparatus according to the present invention has high reliability.

A flexible thermoelectric conversion apparatus according to the present invention does not cause breakage of a magnetic film or an electrode or separation of a junction portion of the magnetic film and the electrode even if a stress is applied to the thermoelectric conversion apparatus. Furthermore, a thermoelectric power is not reduced even if a stress is applied to the thermoelectric conversion apparatus.

Moreover, when a printing process is applied to a thermoelectric conversion apparatus according to the present invention, the device can be packaged in the form of a large-area sheet. Therefore, the thermoelectric conversion apparatus can readily be applied to various heat sources such as a curved surface and a movable component.

That is, with such a device structure, no high stress is applied to the power generation part, which is embedded in a central portion located between the substrate and the cover layer. Therefore, a possibility of breakage of the power generation part is reduced to a large extent even if the device is bent. Furthermore, in the power generation part of another embodiment of the present invention, a first magnetic layer is disposed above the electrode while a second magnetic layer is disposed below the electrode. Thus, a vertically symmetric structure in which the electrode layer is interposed between the magnetic bodies in the vertical direction is employed. Accordingly, the electrode, which involves the highest risk of impaired performance upon breakage, can be embedded in the central portion, to which the lowest stress is applied when the thermoelectric conversion apparatus is bent. As a result, the reliability of the thermoelectric conversion apparatus as a flexible device can further be enhanced. Additionally, in another embodiment of the present invention, the magnetic layer includes of magnetic layer pieces spatially separated from each other. Furthermore, the thermoelectric conversion apparatus is also characterized in that a stress absorption material having elasticity is embedded between a plurality of magnetic bodies.

When an electric power is generated by a temperature gradient in a perpendicular-plane direction, the magnetic layer does not necessarily need to be one continuous body. Therefore, the magnetic layer may be separated into a plurality of magnetic layer pieces, and an organic material or the like that is likely to expand and contract may be filled into gaps between those magnetic layer pieces. In this manner, the flexibility can further be enhanced.

First Embodiment

Configuration

Next, a first embodiment of the present invention will be described with reference to the drawings.

Referring to FIG. 1, which is a perspective view showing a thermoelectric conversion apparatus according to a first embodiment of the present invention, the thermoelectric conversion apparatus has a multilayer structure including a substrate 10 having flexibility, a power generation part 20 including a magnetic layer 21 and an electrode layer 22, and a cover layer 90.

A flexible substrate of an organic resin or the like is used as the substrate 10. A thermoplastic material such as polyolefin or vinyl resin may be used in a case where no intense heat is applied upon production of the device or in applications of thermoelectric conversion at low temperatures. However, in a case of using a process that requires heating, for example, upon deposition of the magnetic layer or the electrode or in applications of thermoelectric conversion at high temperatures of 100° C. or higher, it is particularly preferable to use, as the flexible substrate 10, a substrate made of a resin material that is unlikely to deform even at high temperatures and has high thermal stability, like a substrate made of a thermosetting resin such as a polyimide substrate or a polyester substrate, and an acrylic substrate. Furthermore, the heat resistance can be increased by using a flexible substrate made of metal such as stainless steel (SUS) foil. The thickness $t_s$ of the flexible substrate 10 is not limited to a specific value. Nevertheless, the thickness $t_s$ is preferably about 10 μm to about 300 μm in view of convenience when used as a flexible device.

It is assumed that the magnetic layer 21 has magnetization in a direction parallel to the film surface. If a material has a lower thermal conductivity, it exhibits the thermoelectric effects more efficiently. Therefore, a magnetic insulator is used for the magnetic layer 21 in this embodiment. For example, a magnetic material made of an oxide, such as garnet ferrite or spinel ferrite, may be applied to the magnetic layer 21.

The magnetic layer 21 is deposited on the flexible substrate 10 by using a metal organic deposition method (MOD method), a sol-gel method, an aerosol deposition method (AD method), or the like. When a magnetic material made of an oxide is used for the magnetic layer 21, it is preferable for the magnetic layer 21 to have a thickness $t_m$ not more than 100 μm in order to demonstrate the flexibility.

Furthermore, when a magnetic material having coercivity is used as the magnetic layer 21, a device that can be operated even in an environment of zero magnetic field can be obtained by initializing the magnetization direction of the magnetic layer 21 with an external magnetic field or the like.

The electrode layer 22 includes a material that exhibits the spin-orbit interaction in order to obtain a thermoelectric power with use of the inverse spin Hall effect. Examples of such a material include metal materials that exhibit a relatively high degree of the spin-orbit interaction, such as Au, Pt, Pd, or, Ir and alloys containing such metals. The same effects can be attained when a general metal electrode material, such as Cu, is doped with a material of Au, Pt, Pd, Ir, or the like at only about 0.5% to about 10%.

The electrode layer 22 is deposited by a sputtering method, a vapor deposition method, a plating method, a screen printing method, an ink jet method, or the like. In order to convert spin currents into electricity with high efficiency, it is preferable to set the thickness $t_e$ of the electrode to be at least the spin diffusion length of the metal material. For example, it is preferable to set the thickness $t_e$ of the electrode to be at least 50 nm if the electrode is made of Au. It is preferable to set the thickness $t_e$ of the electrode to be at least 10 nm if the electrode is made of Pt. as the sheet resistance is lower in a sensing application that uses the thermoelectric effect as a voltage signal, a larger thermoelectric power signal is obtained. Therefore, it is preferable to set the thickness $t_e$ of the electrode to be equal to about the spin diffusion length of the metal material. For example, it is preferable to set the thickness $t_e$ of the electrode to be in a range of about 50 nm to about 150 nm if the electrode is made of Au. It is preferable to set the thickness $t_e$ of the electrode to be in a range of about 10 nm to about 30 nm if the electrode is made of Pt. Furthermore, it is preferable to set the thickness $t_e$ of the electrode to be not more than 1 μm in order to demonstrate the flexibility.

A flexible organic resin material or the like is used for the cover layer 90. A material suitable for a coating process or a printing process is preferably used for the cover layer 90. Acrylic resin, polyester, polyimide, or the like may be used. For applications in a low-temperature region of 100° C. or less, polyolefin such as polyethylene or polypropylene or thermoplastic resin such as vinyl resin may be used.

As will be discussed in greater detail below, the thickness $t_c$ of the cover layer 90 is designed to be approximately equal to the thickness $t_s$ of the flexible substrate 10 in order to ensure the stress resistance of the device. Specifically, the thickness $t_c$ of the cover layer 90 is preferably in a range of 60 to 150% of the thickness $t_s$ of the flexible substrate 10.

As described above, for a process involving high-temperature heating, a material having thermal stability not less than the cover layer 90 is used as the flexible substrate 10. In this case, it is preferable to apply a temperature difference for thermoelectric power generation such that the flexible substrate 10 is located on a high-temperature side while the cover layer 90 is located on a low-temperature side.

When a substrate is made of metal in a thermoelectric conversion apparatus according to the present invention, a magnetic layer is formed on the substrate, an electrode layer is formed on the magnetic layer, and a cover layer of resin is formed on the electrode layer. Instead, a cover layer of metal may be formed after an insulating treatment is performed on the electrode layer. Alternatively, after an insulating treatment is performed on a substrate made of metal, an electrode layer may be formed on the substrate, a magnetic layer may be formed on the electrode layer, and a cover layer of resin or metal may be formed on the magnetic layer.

[Generation Effect of Thermoelectric Power]

Figure 2:
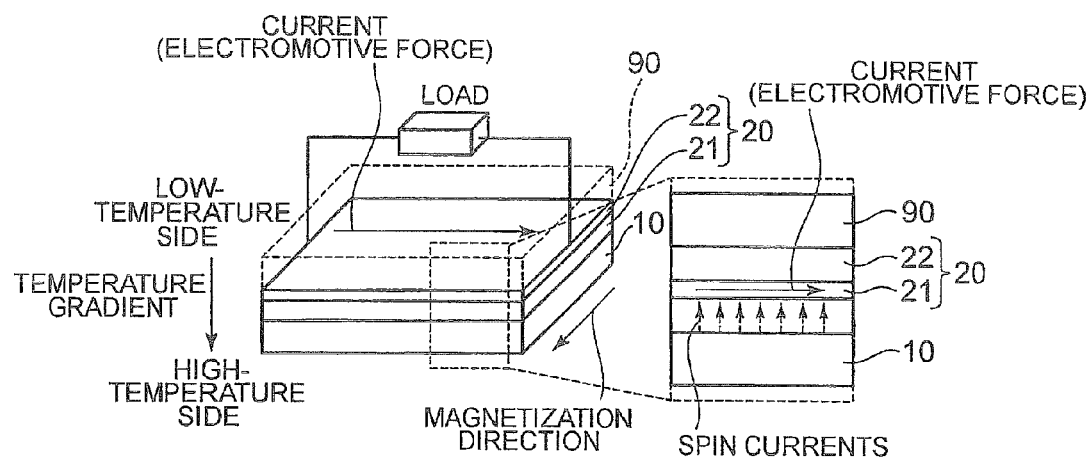
FIG. 2 is a diagram showing a thermoelectric power generating operation of the first embodiment of the present invention.

As shown in FIG. 2, when a temperature gradient is applied to the thermoelectric conversion apparatus in a direction perpendicular to the plane, currents of angular momentum (spin currents) are induced in the direction of this temperature gradient by the spin Seebeck effect in the magnetic layer 21.

Those spin currents generated in the magnetic layer 21 flow into the adjacent electrode layer 22. The spin currents are converted into an electric current (electromotive force) in a direction perpendicular to the magnetization direction of the magnetic layer 21 by the inverse spin Hall effect in the electrode layer 22. In other words, a thermoelectric power is generated from the applied temperature difference in the power generation part 20 including the magnetic layer 21 and the electrode 22.

[Measures to Improve the Reliability (Stress Resistance)]

In order to ensure the device reliability (stress resistance) of a flexible thermoelectric conversion apparatus, the present invention employs a structure in which the power generation part 20, which needs protection against bending stresses, has been embedded in an intermediate portion between the upper cover layer 90 and the lower flexible substrate 10. Particularly, the thickness of the flexible substrate 10 is set to be approximately as the same as the thickness of the cover layer 90 in order to efficiently absorb stresses.

Figure 3:
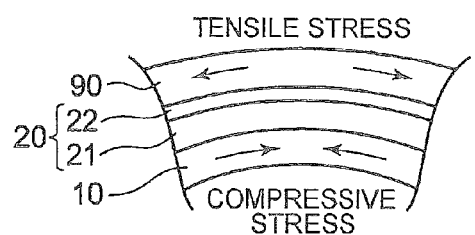
FIG. 3 is a diagram explanatory of a stress load status upon bending in the first embodiment of the present invention.

With the device thus constructed, when the device is bent as shown in FIG. 3, for example, a tensile stress is applied to the upper cover layer 90, whereas a compressive stress is applied to the lower substrate 10. On the other hand, a stress is relatively unlikely to be applied to the power generation part 20, which is located at a central portion of the device. As a result, the risk of breakage upon bending is greatly reduced, so that a flexible thermoelectric conversion apparatus with high reliability (stress resistance) can be provided.

Example 1

Figure 4:
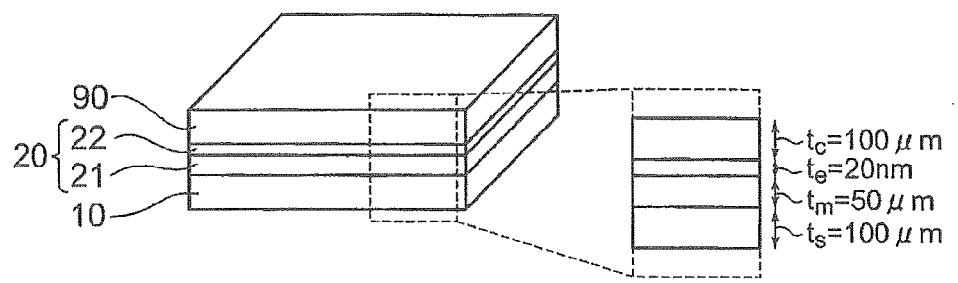
FIG. 4 is a perspective view showing a thermoelectric conversion apparatus according to Example 1 of the present invention.

Referring to FIG. 4, in a thermoelectric conversion apparatus according to Example 1 of the present invention, a yttrium iron garnet (with composition of $BiY_2Fe_5O_{12}$; hereinafter referred to as Bi:YIG) film in which Bi has been substituted for part of Y sites is used as the magnetic layer 21. Pt is used as the electrode layer 22. Here, the thickness of the magnetic layer 21 (Bi:YIG film) is set such that $t_m$=50 μm, and the thickness of the electrode layer 22 (Pt electrode) is set such that $t_e$=20 nm. A polyimide substrate is used as the flexible substrate 10, and an acrylic resin is used as the cover layer 90. The thicknesses of the flexible substrate 10 and the cover layer 90 are set such that $t_s$=$t_c$=100 μm.

The magnetic layer 21, which is formed of Bi:YIG is deposited by an AD method. As a Bi:YIG material, Bi:YIG particulates having a diameter of 300 nm are used. Those Bi:YIG particulates are packed into an aerosol generation container, and the polyimide substrate 10 is fixed on a holder in a deposition chamber. In this state, a pressure difference is generated between the deposition chamber and the aerosol generation container, so that the Bi:YIG particulates are drawn into the deposition chamber and blown onto the substrate 10 through a nozzle. The collision energy at the substrate 10 allows the particulates to be ground and re-coupled, so that Bi:YIG polycrystal is formed on the substrate 10 (polyimide substrate). A substrate stage, which is not shown in the drawings, is two-dimensionally scanned to deposit a uniform magnetic layer 21 (Bi:YIG film) on the substrate 10 with a thickness of 20 μm.

Then a surface of the magnetic layer 21 is polished as needed. Thereafter, an electrode layer 22 (Pt electrode) is deposited with a thickness of 20 nm by a sputtering method.

Finally, an organic solution in which polymethyl methacrylate has been dissolved as an acrylic material is applied onto the electrode layer 22 (Pt electrode), which is dried at a high temperature of about 100° C. to form a cover layer 90.

Second Embodiment

Figure 5:
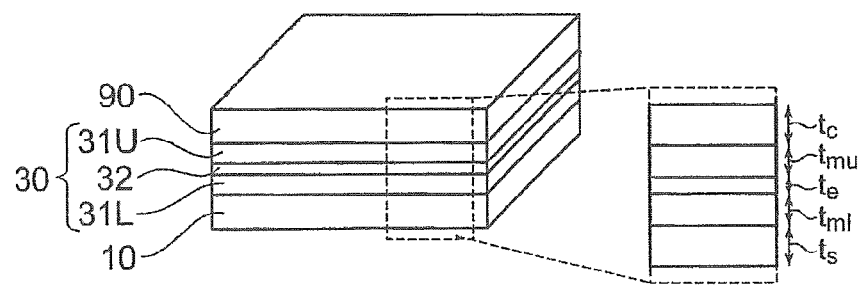
FIG. 5 is a perspective view showing a thermoelectric conversion apparatus according to a second embodiment of the present invention.

Referring to FIG. 5, which shows a thermoelectric conversion apparatus according to a second embodiment of the present invention, the thermoelectric conversion apparatus includes magnetic layers of a first magnetic layer (lower magnetic layer) 31L formed on one layer surface of the electrode layer 32 and a second magnetic layer (upper magnetic layer) 31U formed on the other layer surface of the electrode layer 32.

The magnetic body, the electrode layer 32, the flexible substrate 10, the cover layer 90, and the like may employ the same materials as used in the first embodiment. As with the first embodiment, the thickness $t_c$ of the cover layer 90 is designed to be nearly equal to the thickness $t_s$ of the flexible substrate 10.

Specifically, the second embodiment differs from the first embodiment in that the power generation part 30 is formed by a multilayer structure of the upper magnetic layer 31U, the electrode layer 32, and the lower magnetic layer 31L. At that time, it is preferable for the upper magnetic layer 31U to have roughly the same thickness as the lower magnetic layer 31L. More specifically, the thickness $t_{mu}$ of the upper magnetic layer 31U is preferable in a range of 60 to 150% of the thickness $t_{ml}$ of the lower magnetic layer 31L.

Use of such a vertically symmetric structure can achieve the following performance improvements as compared to the first embodiment.

(1) Because the electrode layer 32 is embedded in the center of the vertically symmetric multilayered structure, the thermoelectric conversion apparatus becomes more robust against bending.

(2) Because magnetic bodies are arranged above and below the electrode layer 32, the spin Seebeck effects from both of those magnetic bodies can be utilized. Therefore, thermoelectric power generation can be achieved with higher efficiency.

Figure 6:
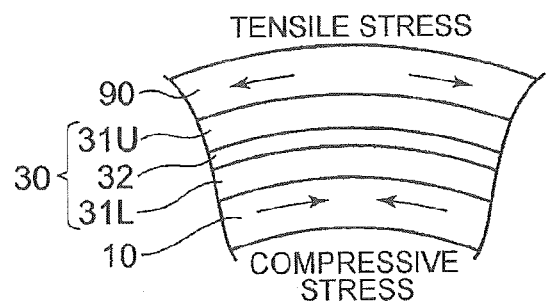
FIG. 6 is a diagram explanatory of a stress load status upon bending in the second embodiment of the present invention.

First, the aforementioned advantage (1) of the high reliability will be described. In a case where a temperature gradient in a perpendicular-plane direction is used with respect to a magnetic layer, even if a crack is produced in part of the magnetic layer, spin currents flowing in the perpendicular-plane direction (direction in parallel to a crack surface) are not greatly affected by the crack. Thus, the thermoelectric power generation performance is not significantly lowered. In contrast, if the electrode layer 32 is broken, the circuit becomes open (disconnected). Therefore, an electric current flowing in the in-plane direction of the electrode layer 32 cannot be derived, so that the thermoelectric conversion becomes impossible. Similarly, if a junction interface between the electrode and the magnetic body is broken or separated, spin currents cannot be derived from the magnetic body. Thus, the thermoelectric conversion becomes impossible. Accordingly, it is the most important to ensure stress resistances of the electrode layer 32 and the interface of the electrode layer 32 for a flexible operation. The present embodiment is configured based upon such design guidelines. Since the electrode layer 32 is located at the center of the vertically symmetric multilayered structure, stresses applied to the electrode layer 32 upon bending are reduced as shown in FIG. 6. Thus, the aforementioned possibility of breakage of the electrode or disconnection of the circuit can be lowered.

Figure 7:
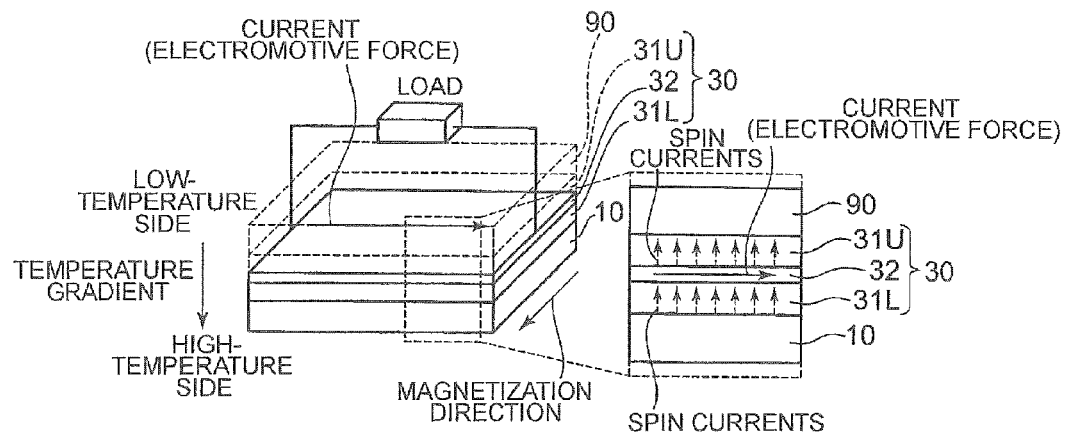
FIG. 7 is a diagram showing a thermoelectric power generating operation of the second embodiment of the present invention.

Furthermore, the aforementioned advantage (2) can increase the efficiency. If a temperature gradient is applied to such a structure in the perpendicular-plane direction as shown in FIG. 7, spin currents are induced by the spin Seebeck effect in each of the upper magnetic layer 31U and the lower magnetic layer 31L. Those spin currents contribute to generation of electromotive forces having the same sign in the adjacent electrode layer 32 (and thus strengthen electromotive forces). Therefore, the thermoelectric power generation effects obtained can be doubled as compared to the first embodiment.

Example 2

Figure 8:
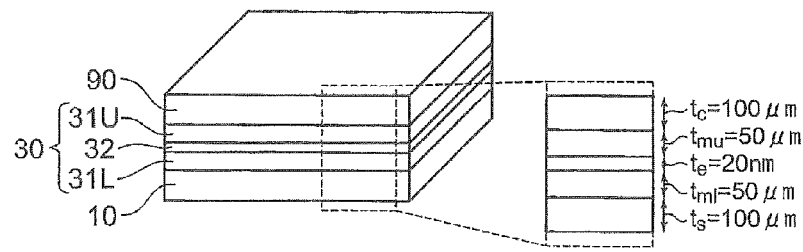
FIG. 8 is a perspective view showing a thermoelectric conversion apparatus according to Example 2 of the present invention.

FIG. 8 shows a specific example of the present embodiment. Bi:YIG is used for each of the lower magnetic layer 31L and the upper magnetic layer 31U, and Pt is used for the electrode layer 32. The thickness of the lower magnetic layer 31L and the upper magnetic layer 31U (Bi:YIG films) is set so that $t_{ml}=t_{mu}=50$ µm, and the thickness of the electrode layer 32 (Pt electrode) is set so that $t_e=20$ nm. A polyimide substrate having a thickness of 100 µm is used for the flexible substrate 10, and an acrylic resin having a thickness of 100 µm is used for the cover layer 90. For example, the same process as described in the first embodiment can be used for manufacturing the thermoelectric conversion apparatus.

Third Embodiment

Figure 9:
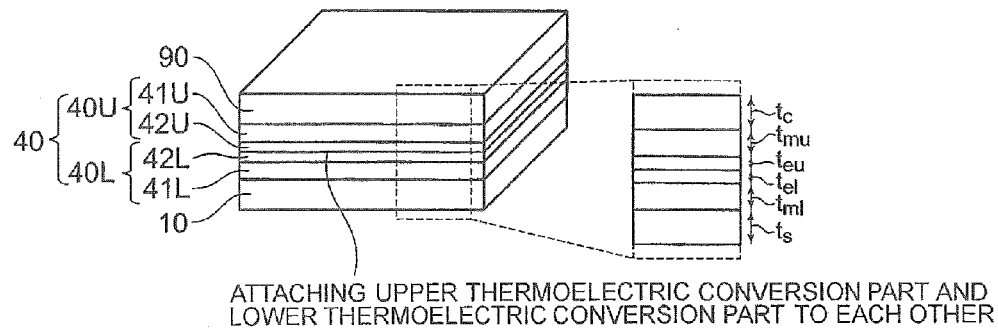
FIG. 9 is a perspective view showing a thermoelectric conversion apparatus according to a third embodiment of the present invention.

Referring to FIG. 9, which shows a thermoelectric conversion apparatus according to a third embodiment of the present invention, the thermoelectric conversion apparatus includes a plurality of power generation parts (a lower power generation part 40L and an upper power generation part 40U) stacked on a substrate 10.

That is, this thermoelectric conversion apparatus uses a basic design method of arranging magnetic layers above and below an electrode layer for enhancing the reliability and increasing the efficiency as with the aforementioned second embodiment. This thermoelectric conversion apparatus differs from the second embodiment in that the thermoelectric conversion apparatus is formed by attaching a lower power generation part 40L and an upper power generation part 40U, which are produced by the same method, to each other at their electrode surfaces with a conductive adhesive material or the like for simplifying a device fabrication process.

Specifically, two power generation parts of the lower power generation part 40L and the upper power generation part 40U, which constitute a power generation part 40, jointly form a single electrode layer by attaching an electrode layer 42L of the lower power generation part 40L and an electrode layer 42U of the upper power generation part 40U to each other. Thus, a magnetic layer 41L of the lower power generation part 40L is formed on one of layer surfaces of this electrode layer, and a magnetic layer 41U of the upper power generation part 40U is formed on the other layer surface of this electrode layer.

Figure 10:
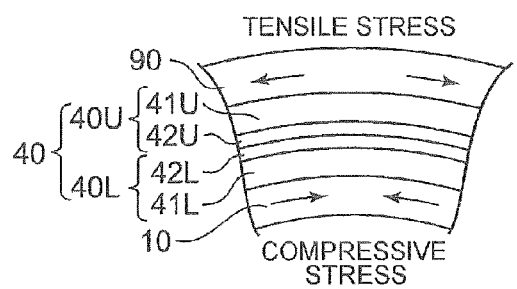
FIG. 10 is a diagram explanatory of a stress load status upon bending in the third embodiment of the present invention.
Figure 11:
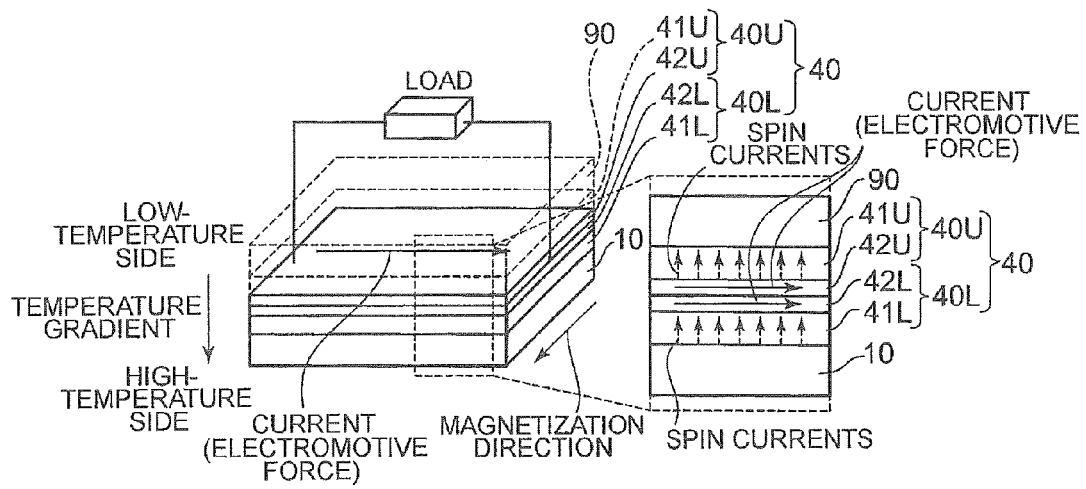
FIG. 11 is a diagram showing a thermoelectric power generating operation of the third embodiment of the present invention.

With applying such a configuration, as shown in FIG. 10, a structure in which stresses are unlikely to be applied to a junction interface of the electrode and the magnetic body can be achieved as with the aforementioned embodiments. Furthermore, as shown in FIG. 11, thermoelectric powers can efficiently be derived from both of the lower power generation part 40L and the upper power generation part 40U.

Example 3

Figure 12:
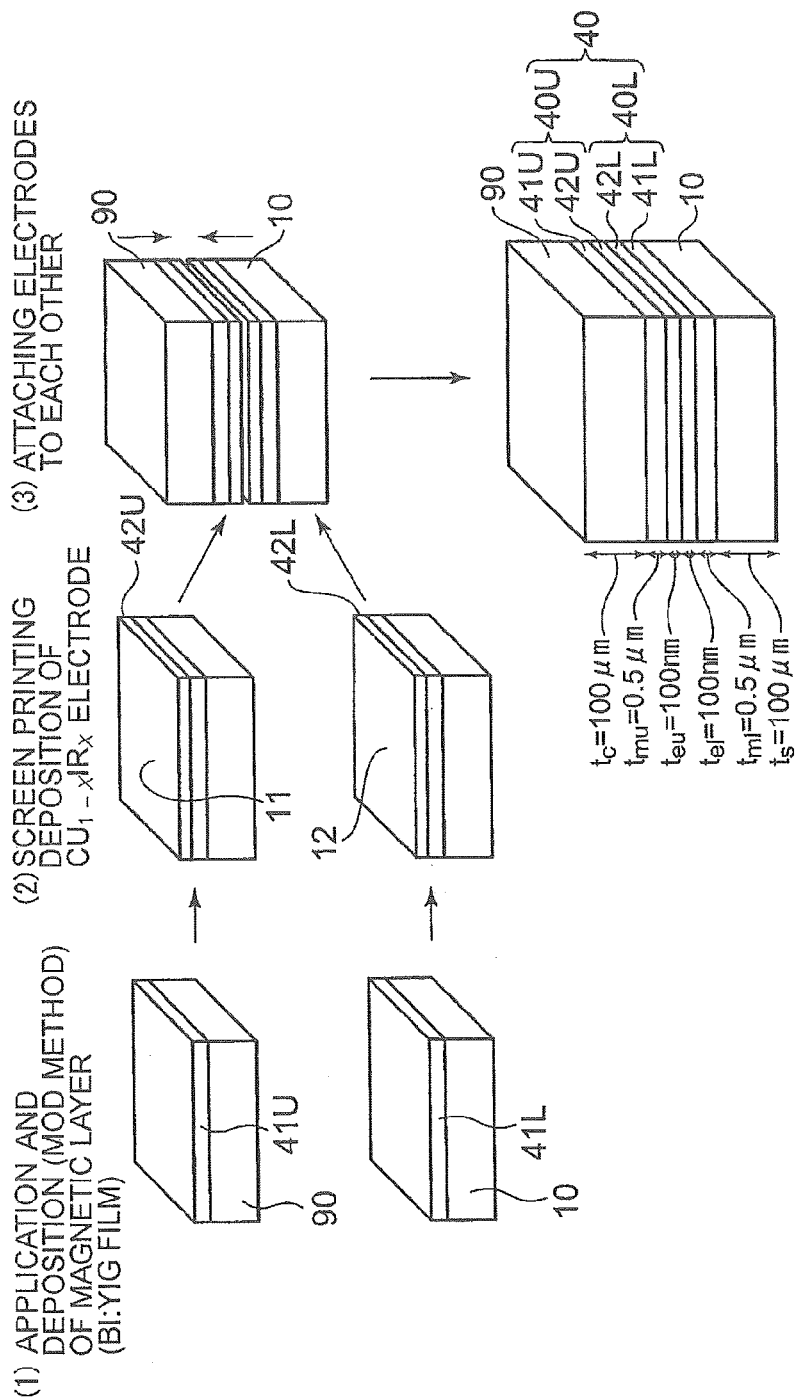
FIG. 12 is a perspective view showing a thermoelectric conversion apparatus according to Example 3 of the present invention.

Referring to FIG. 12, which shows a method of manufacturing this thermoelectric conversion apparatus, stainless steel (SUS) foil, which has high heat resistance, is used for the flexible substrate 10 and the cover layer 90. The thickness of each of the flexible substrate 10 and the cover layer 90 is 100 µm. With the substrate 10 and the cover layer 90 (SUS foil), the lower power generation part 40L and the upper power generation part 40U are produced by the same process, which will be shown below.

(1) First, a Bi:YIG film having a thickness of 500 nm is respectively deposited as the magnetic layers 41L and 41U on the substrate 10 and the cover layer 90 (SUS foil) by a metal organic deposition method (MOD method). For example, a MOD solution manufactured by Kojundo Chemical Lab. Co., Ltd. is used for the Bi:YIG solution. Within this solution, a magnetic metal material with a proper mole fraction (Bi:Y:Fe=1:2:5) is dissolved in acetic ester at a concentration of 5%. This solution is applied onto the substrate 10 and the cover layer 90 (SUS foil) by a spin-coating method (with a revolving speed of 1,000 rpm and 30-second rotation). The substrate 10 and the cover layer 90 are dried with a hot plate of 150° C. for 5 minutes. Then the substrate 10 and the cover layer 90 are sintered at a high temperature of 600° C. in an electric furnace for 14 hours. Thus, the magnetic layers 41L and 41U (Bi:YIG films) having a thickness of about 500 nm are formed on the substrate 10 and the cover layer 90 (SUS foil), respectively.

(2) Next, $Cu_{1-x}Ir_x$ having a thickness of 100 nm in which copper has been doped with a small amount of iridium is deposited on the magnetic layers 41L and 41U as the electrode layers 42L and 42U by a screen printing method. In this example, an electrode material doped with Ir at 1%, $Cu_{0.99}Ir_{0.01}$, is used. An alloy of $Cu_{0.99}Ir_{0.01}$ is granulated into particulates having a particle diameter of about 50 nm, mixed with a binder, and used as ink (paste) for the screen printing.

(3) Finally, the lower power generation part 40L and the upper power generation part 40U produced by the above processes (1) and (2) are fixed to each other by attaching the electrode layer 42L and the electrode layer 42U to each other. Silver paste is used for fixing and is thinly spread on interfaces of those electrode layers.

With the above processes, a thermoelectric conversion apparatus can readily be configured with high reliability and high efficiency.

Fourth Embodiment

A thermoelectric conversion apparatus according to a fourth embodiment of the present invention has a magnetic layer including a plurality of magnetic layer pieces separated in the layer direction with a gap portion interposed therebetween. Alternatively, the thermoelectric conversion apparatus according to the fourth embodiment of the present invention further includes a stress absorption layer of an elastic material embedded in a gap portion.

As described above, in the magnetic layer, spin currents flow in a perpendicular-plane direction of the device. Therefore, the entire layer of the magnetic layer does not need to be continuously connected. Thus, the magnetic layer may be formed of a plurality of magnetic bodies separated from each other. Furthermore, a gap portion may be present between those magnetic bodies, or the magnetic bodies may be isolated from each other with an elastic material interposed therebetween. With such a proper structure provided in the magnetic layer, the flexibility can further be enhanced.

Various forms of a method of arranging a plurality of magnetic bodies and a method of isolating those magnetic bodies may be used depending upon the application. As examples of such structures, forms illustrated in FIGS. 13 to 15 will be described.

Figure 13:
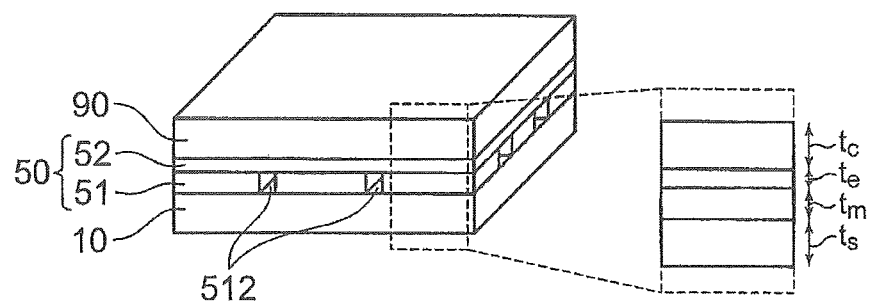
FIG. 13 is a perspective view showing a thermoelectric conversion apparatus according to a fourth embodiment of the present invention.

Referring to FIG. 13, in this thermoelectric conversion apparatus, a magnetic layer 51, which constitutes a power generation part 50 along with an electrode layer 52, includes of magnetic layer pieces separated in the layer direction with gap portions 512 that are in the form of "parallel crosses" (not shown) in the magnetic layer 51. The shape of the gap portions 512 in the magnetic layer 51 is not limited to a single set of "parallel crosses," and any shape or number of the gap portions 512 may be used as long as it is advantageous in a desired deflected shape or a desired degree of deflection of the thermoelectric conversion apparatus.

The gap portions 512 are formed between a plurality of magnetic layer pieces separated in the layer direction of the magnetic layer 51.

Figure 14:
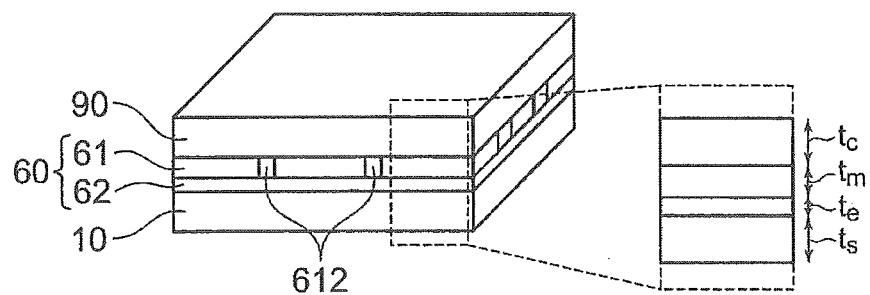
FIG. 14 is a perspective view showing a thermoelectric conversion apparatus according to the fourth embodiment of the present invention.

Referring to FIG. 14, in this thermoelectric conversion apparatus, a magnetic layer 61, which constitutes a power generation part 60 along with an electrode layer 62, includes of magnetic layer pieces separated in the layer direction with gap portions that are in the form of "parallel crosses" (not shown) in the magnetic layer 61. Furthermore, this thermoelectric conversion apparatus further includes a stress absorption layer 612 of an elastic material embedded in the gap portions, which are in the form of "parallel crosses" (not shown) in the magnetic layer 61. The shape of the stress absorption layer 612 in the magnetic layer 61 is not limited to a single set of "parallel crosses," and any shape or number of the stress absorption layer 612 may be used as long as it is advantageous in a desired deflected shape or a desired degree of deflection of the thermoelectric conversion apparatus. In other words, in this thermoelectric conversion apparatus, a stress absorption layer 612 capable of absorbing stresses upon bending is formed instead of the gap portions of the thermoelectric conversion apparatus illustrated in FIG. 13. The stress absorption layer 612 is formed of a material having high elasticity.

With use of the structure shown in FIG. 13 or 14, the device can be bent more easily about a portion of the gap portions or the stress absorption layer. Thus, no high stress is applied to the magnetic layer pieces. Accordingly, a thermoelectric conversion apparatus with higher flexibility can be achieved.

Figure 15:
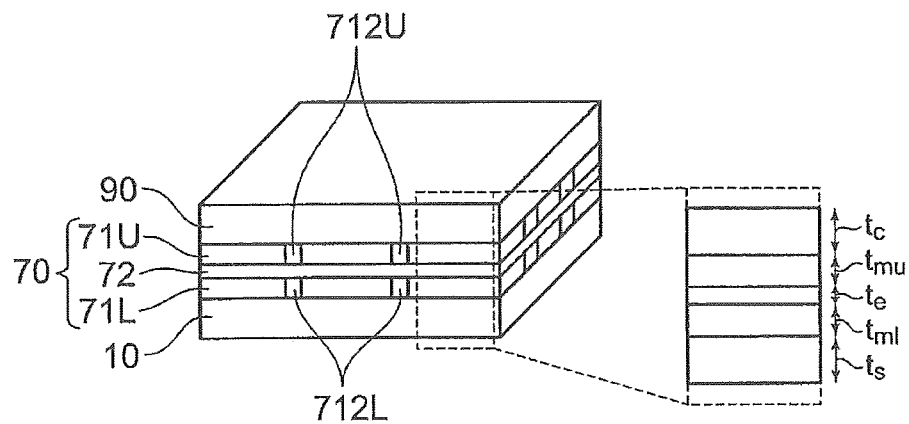
FIG. 15 is a perspective view showing a thermoelectric conversion apparatus according to the fourth embodiment of the present invention.

Alternatively, a thermoelectric conversion apparatus shown in FIG. 15 has a power generation part 70 in which a first magnetic layer (lower magnetic layer) 71L and a second magnetic layer (upper magnetic layer) 71U are arranged on both of layer surfaces of an electrode layer 72 as with the second embodiment. Each of the lower magnetic layer 71L and the upper magnetic layer 71U includes of magnetic layer pieces separated in the layer direction with gap portions that are in the form of "parallel crosses" (not shown) in the magnetic layer. Furthermore, the thermoelectric conversion apparatus further includes a lower stress absorption layer 712L and an upper stress absorption layer 712U of an elastic material embedded in the gap portions, which are in the form of "parallel crosses" (not shown) in the respective magnetic layers. The shape of each of the lower stress absorption layer 712L and the upper stress absorption layer 712U in the respective magnetic layer is not limited to a single set of "parallel crosses," and any shape or number of each of the lower stress absorption layer 712L and the upper stress absorption layer 712U may be used as long as it is advantageous in a desired deflected shape or a desired degree of deflection of the thermoelectric conversion apparatus.

Next, the thermoelectric conversion apparatus shown in FIG. 15 will be described in greater detail. The lower magnetic layer 71L and the upper magnetic layer 71U can be formed of the same magnetic material as used in the second embodiment. Since no high bending stress is applied to a plurality of magnetic layer pieces, the thicknesses $t_{mu}$ and $t_{ml}$ of the lower magnetic layer 71L and the upper magnetic layer 71U may be greater than those of the second embodiment.

Figure 16:
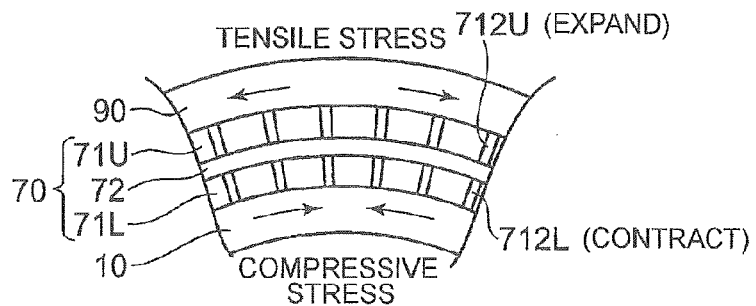
FIG. 16 is a diagram explanatory of a stress load status upon bending in the fourth embodiment of the present invention.

It is preferable to use a material having high elasticity for the lower stress absorption layer 712L and the upper stress absorption layer 712U. Polyester, polypropylene, silicone resin, or the like may be used for the lower stress absorption layer 712L and the upper stress absorption layer 712U. Thus, by using a stretchable material for the lower stress absorption layer 712L and the upper stress absorption layer 712U, even if the device is bent as shown in FIG. 16, either the lower stress absorption layer 712L or the upper stress absorption layer 712U expands while the other contracts. Therefore, stresses applied to the entire device can be absorbed.

Figure 17:
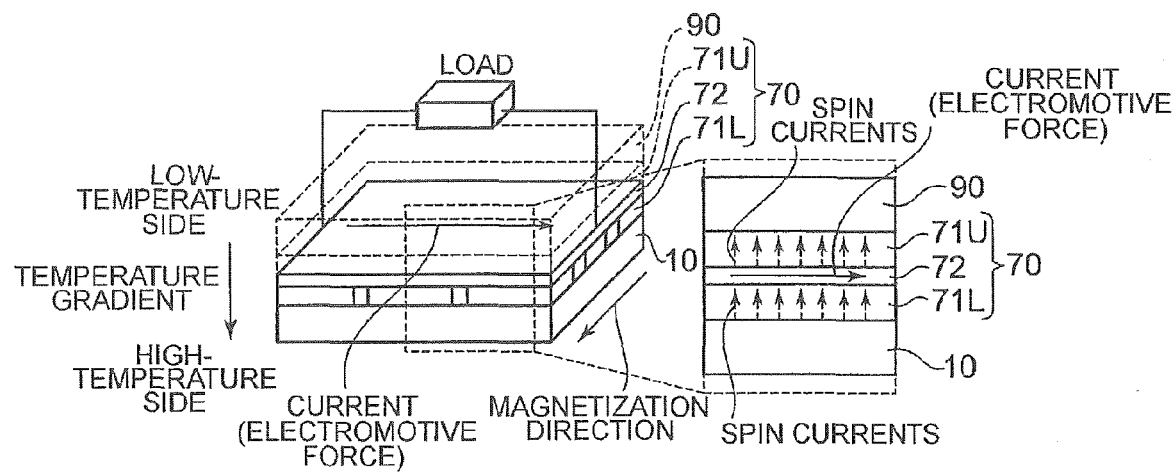
FIG. 17 is a diagram showing a thermoelectric power generating operation of the fourth embodiment of the present invention.

If a temperature gradient is applied to such a structure as shown in FIG. 17, spin currents induced in the upper and lower magnetic layers generate electromotive forces having the same sign in the electrode layer 72 as with the second embodiment. Thus, efficient thermoelectric conversion can be achieved.

For purposes of illustration, the shape and number of gap portions illustrated in FIG. 16 are different from those shown in FIGS. 15 and 17.

Example 4

Figure 18:
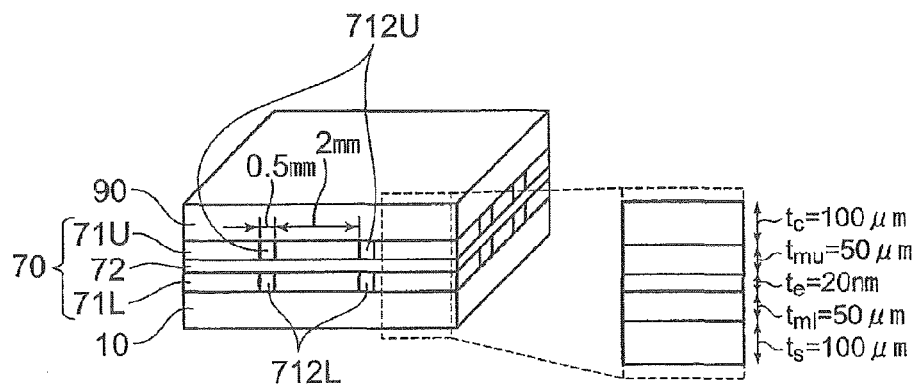
FIG. 18 is a perspective view showing a thermoelectric conversion apparatus according to Example 4 of the present invention.

FIG. 18 shows a specific example of this embodiment. Bi:YIG is used for each of the lower magnetic layer 71L and the upper magnetic layer 71U. Pt is used for the electrode layer 72. The thicknesses of the lower magnetic layer 71L and the upper magnetic layer 71U (Bi:YIG films) are set such that $t_{ml}=t_{mu}=50$ μm, and the thickness of the electrode layer 72 (Pt electrode) is set such as $t_g=20$ nm. A polyimide substrate having a thickness of 100 μm is used as the flexible substrate 10, an acrylic resin having a thickness of 100 μm is used as the cover layer 90, and a silicone resin is used as the lower stress absorption layer 712L and the upper stress absorption layer 712U. The same processes as described in first embodiment or will be described in a sixth embodiment can be used for manufacturing the thermoelectric conversion apparatus.

Fifth Embodiment

As described above, in order to provide a flexible thermoelectric conversion apparatus, the thickness of a power generation part is limited to be a certain value or less. However, if a power generation part has an insufficient thickness, it may be difficult to apply a temperature difference to the power generation part in some applications. In such a case, highly efficient thermoelectric power generation may not be achieved. For such applications, this problem can be solved by providing a plurality of power generation parts with flexible spacer layers interposed between the power generation parts.

Figure 19:
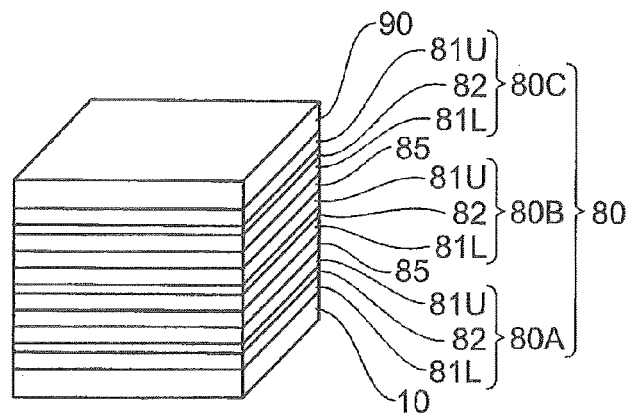
FIG. 19 is a perspective view showing a thermoelectric conversion apparatus according to a fifth embodiment of the present invention.

Referring to FIG. 19, a thermoelectric conversion apparatus according to a fifth embodiment of the present invention has a plurality of power generation parts 80A-80C stacked on a substrate 10. Spacer layers 85 made of a flexible material are formed between the power generation parts 80A-80C. In each of the power generation parts 80A-80C, a first magnetic layer (lower magnetic layer) 81L and a second magnetic layer (upper magnetic layer) 81U are arranged on both of layer surface of an electrode layer 82 as with the second embodiment.

In order to ensure the flexibility, each of the power generation parts 80A-80C preferably has a thickness not more than 100 μm. A material having high elasticity is used for the spacer layers 85. For example, polyester such as PET or PEN, polypropylene, or silicone resin may be used for the spacer layers 85. The spacer layers 85 preferably have a thickness not more than 300 μm.

With use of such a structure, while the flexibility can be ensured with limited thicknesses of the power generation parts 80A-80C, highly efficient thermoelectric power generation can be achieved by the multilayered structure.

Example 5

Figure 20:
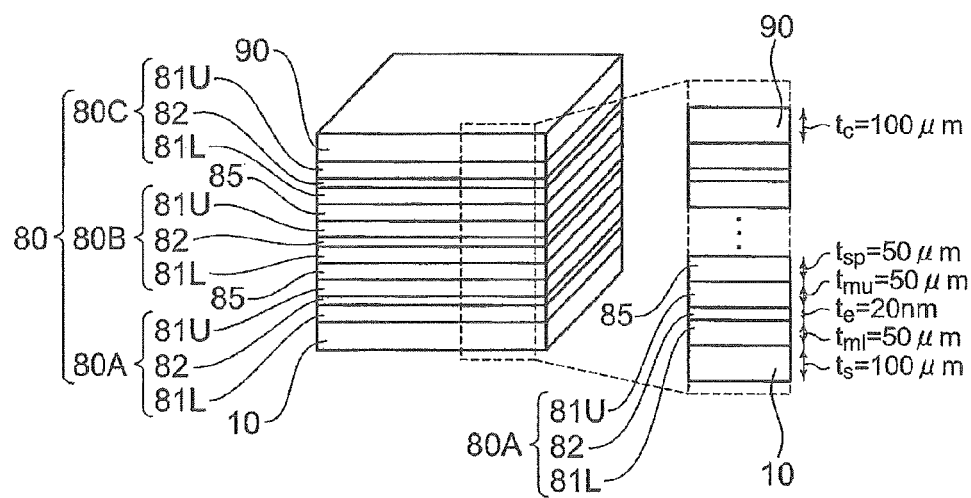
FIG. 20 is a perspective view showing a thermoelectric conversion apparatus according to Example 5 of the present invention.

Referring to FIG. 20, in a thermoelectric conversion apparatus of Example 5, Bi:YIG is used for each of the lower magnetic layer 81L and the upper magnetic layer 81U, and Pt is used for the electrode layer 82. The thickness of the lower magnetic layer 81L and the upper magnetic layer 81U (Bi:YIG films) is set so that $t_{ml}=t_{mu}=50$ μm, and the thickness of the electrode layer 82 (Pt electrode) is set so that $t_0=20$ nm. A polyimide substrate having a thickness of 100 μm is used for the flexible substrate 10, and an acrylic resin having a thickness of 100 μm is used for the cover layer 90. Polyethylene terephthalate (PET) having a thickness of 50 μm is used for the spacer layers 85. The same process as described in the first embodiment or will be described in a sixth embodiment can be used for manufacturing the thermoelectric conversion apparatus.

Each of the power generation parts is not limited to the structure illustrated in FIGS. 19 and 20. The structures described in the first embodiment and the third embodiment may be used instead.

Sixth Embodiment

Manufacturing Method with Roll-to-Roll Process

A thermoelectric conversion apparatus having a wide area according to the present invention can be manufactured by a roll-to-roll process as a low-cost mass production technique, which includes feeding a rolled film as a substrate, sequentially forming a power generation part and a cover layer, and then re-rolling up the film. The rolled thermoelectric conversion apparatus thus produced is cut with a length as needed for use.

Here, a process of forming a power generation part includes a step of applying ink containing metal onto the film as the substrate or a magnetic layer by a printing method, and drying the ink to form an electrode layer and a step of supplying a fluid containing magnetic material onto the electrode layer or the film as the substrate by a metal organic deposition method, a sol-gel method or an aerosol deposition method, and drying the fluid to form a magnetic layer.

Furthermore, a process of forming a cover layer includes applying ink containing resin onto the film as the substrate by a printing method so that at least the power generation part is covered with the ink and drying the ink to form a cover layer.

Example 6

Figure 21:
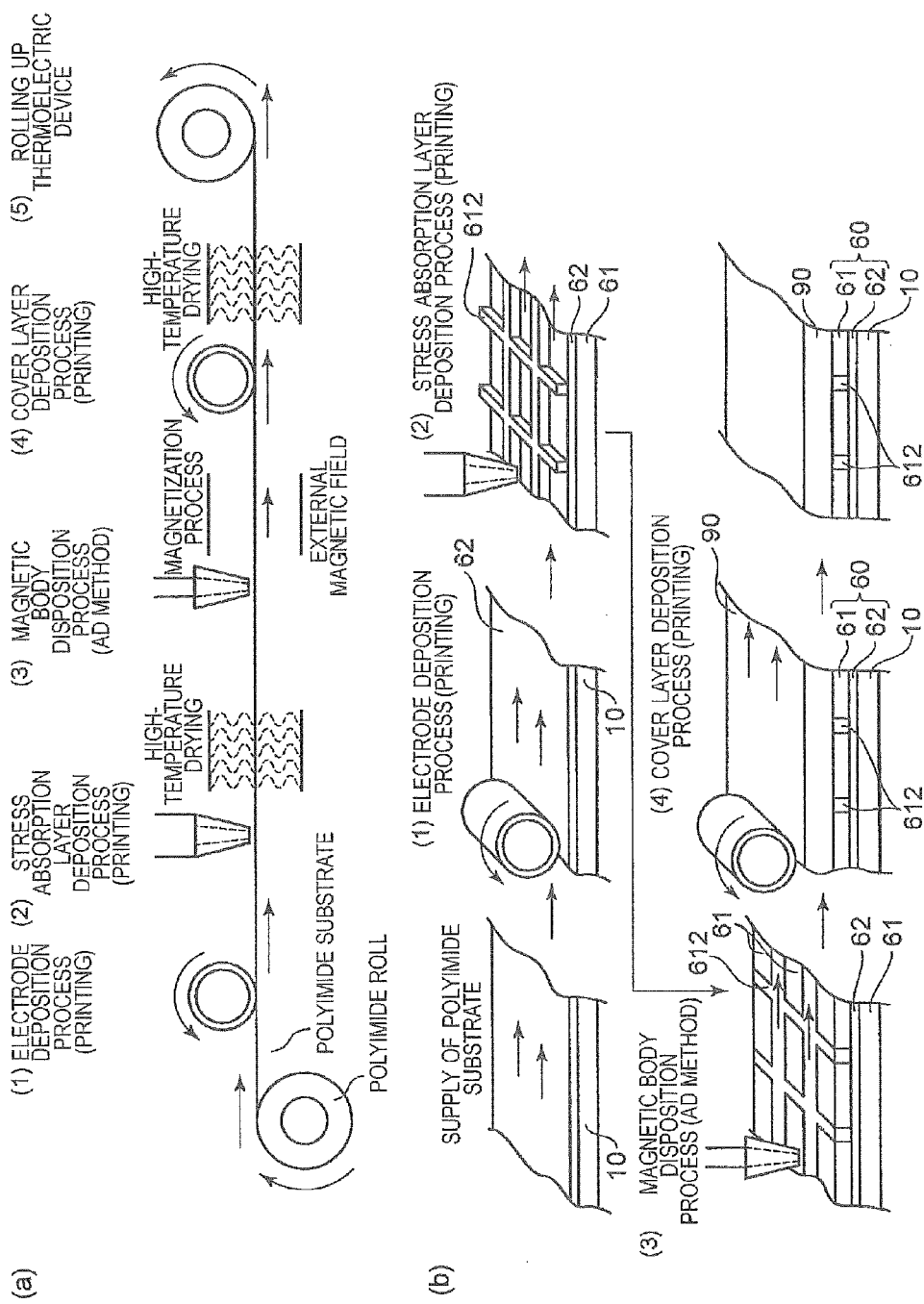
FIG. 21 shows, in (a) and (b), diagrams showing a method of manufacturing a thermoelectric conversion apparatus according to a roll-to-roll method of Example 6 of the present invention.

A method of manufacturing a thermoelectric conversion apparatus of the fourth embodiment illustrated in FIG. 14 by a roll-to-roll process will be described with reference to FIGS. 21(a) and 21(b).

In this manufacturing method, while a rolled film is fed as the substrate 10 from an inlet port of the manufacturing line, a power generation part 60 (steps (1) to (3)) and a cover layer 90 (step (4)) are sequentially formed. Then the film is re-rolled up at an outlet port of the manufacturing line.

(1) Ink containing Au, Pt, or the like is applied onto the film made of polyimide as the substrate 10 by a printing method and dried so that an electrode layer 62 is formed.

(2) Ink containing elastic material is applied onto a region of the electrode layer 62 that is in the form of "parallel crosses" on which a stress absorption layer 612 is to be formed by a printing method and dried so that a stress absorption layer 612 is formed.

(3) A fluid containing magnetic material is supplied onto a region of the electrode layer 62 in which a magnetic layer 61 is to be formed but no stress absorption layer 612 has been formed by an AD method and dried so that a plurality of magnetic layer pieces are formed.

A magnetic layer 61 is formed by the steps (2) and (3). Furthermore, a power generation part 60 is formed by the steps (1) to (3).

(4) Ink containing resin is applied onto the film as the substrate 10 by a printing method so that at least the power generation part 60 is covered with the ink and dried so that a cover layer 90 is formed.

A cover layer 90 is formed by the step (4). Thus, a thermoelectric conversion apparatus having a wide area is formed by the steps (1) to (4). The thermoelectric conversion apparatus thus produced is re-rolled up.

The aforementioned method may be performed in a different sequence. After a magnetic layer 61 including a stress absorption layer 612 and a plurality of magnetic layer pieces is formed on the substrate 10, an electrode layer 62 may be formed on the magnetic layer 61. Then a cover layer 90 may be formed.

Seventh Embodiment

A flexible thermoelectric conversion apparatus according to the present invention can be mounted on an outer circumferential surface of a cylindrical member because of the flexibility of a substrate, a power generation part, and a cover layer. Specifically, a thermoelectric conversion apparatus according to a seventh embodiment of the present invention further includes a cylindrical member.

More particularly, the thermoelectric conversion apparatus further includes a cylindrical member in the form of a pipe. The substrate, the power generation part and the cover layer are arranged so that the magnetization direction of the magnetic layer of the power generation part disposed outside of the pipe is aligned with an axial direction of the cylindrical member of the cylindrical member. The cylindrical member allows a heat source or a cold source to flow or remain inside thereof.

Example 7

Figure 22:
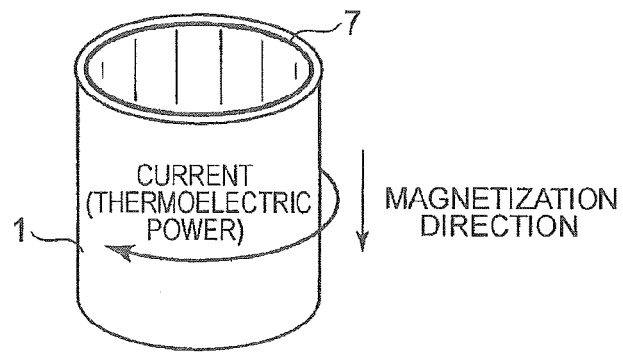
FIG. 22 is a perspective view showing a thermoelectric conversion apparatus according to Example 7 of the present invention.

Referring to FIG. 22, a thermoelectric conversion apparatus according to Example 7 of the present invention further includes a cylindrical member 7 in the form of a pipe. A flexible thermoelectric conversion device 1 including a substrate, a power generation part, and a cover layer is disposed outside of the cylindrical member 7 so that the magnetization direction of a magnetic layer of the power generation part is aligned with an axial direction of the cylindrical member. The cylindrical member allows a heat source or a cold source to flow or remain inside thereof. Thermoelectric powers are generated in an electrode layer of the thermoelectric conversion device 1 as electric currents flowing in a circumferential direction of the cylindrical member 7.

Figure 23:
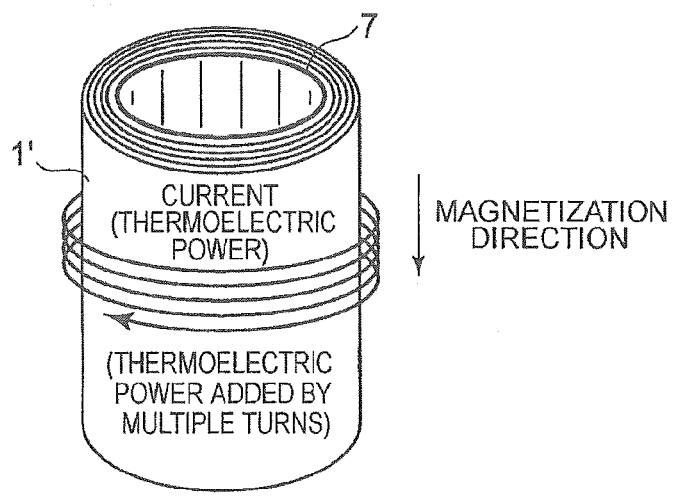
FIG. 23 is a perspective view showing a thermoelectric conversion apparatus according to a variation of Example 7 of the present invention.

Referring to FIG. 23, a thermoelectric conversion apparatus according to a variation of Example 7 of the present invention also has a cylindrical member 7 in the form of a pipe. A flexible thermoelectric conversion device 1' including a substrate, a power generation part, and a cover layer is disposed outside of the cylindrical member 7 so that the magnetization direction of a magnetic layer of the power generation part is aligned with an axial direction of the cylindrical member. The cylindrical member allows a heat source or a cold source to flow or remain inside thereof. Thermoelectric powers are generated in an electrode layer of the thermoelectric conversion device 1' as electric currents flowing in a circumferential direction of the cylindrical member 7. In particular, the flexible thermoelectric conversion device 1' including the substrate, the power generation part and the cover layer is wound with multiple turns in the circumferential direction of the cylindrical member 7. In this case, thermoelectric powers are effectively added, so that high thermoelectric effects can be obtained as with the multilayered structure of the power generation part 30 shown in the fourth embodiment. In order to improve thermal contact between overlapping portions of the thermoelectric conversion apparatus wound with multiple turns, it is preferable to form a sticky member having a high heat conductivity that also serves as a locking device on a surface of the cover layer or the substrate of the thermoelectric conversion device 1'.

If a soft sleeve is used as the cylindrical member 7, the thermoelectric conversion apparatus can be mounted on and wound around an arm, a leg, a head, a trunk of an animal including a human.

Eighth Embodiment

An eighth embodiment of the present invention is an example of applications of a thermoelectric conversion apparatus according to the present invention.

An electronic device as an example of applications of a thermoelectric conversion apparatus according to the present invention has a flexible support member detachably mounted on a heat source or a cold source, and a signal generation device, a wireless transmission device, and a thermoelectric conversion apparatus, which are mounted on the support member. The signal generation device is operable to generate electrical signals. The wireless transmission device is operable to transmit the electrical signals generated by the signal generation device as wireless signals.

The thermoelectric conversion apparatus applies thermoelectric powers as a power supply to one or both devices of the signal generation device and the wireless transmission device that need supply of electric power (usually, at least the wireless transmission device).

Therefore, when the support member is mounted on a heat source or a cold source, an autonomous electronic device having the signal generation device and the wireless transmission device that do not need an external power supply can be constructed. This electronic device can be used at a place or in a situation in which it is difficult to ensure or replace a power supply. Additionally, since the support member and the thermoelectric conversion apparatus of this electronic device are flexible, the electronic device can also be mounted on a variable body or a movable body, such as a body of an animal including a human as a heat source or a cold source. At the same time, the electronic device can normally operate while it continuously receives thermal energy from a heat source or a cold source.

Example 8

Figure 24:
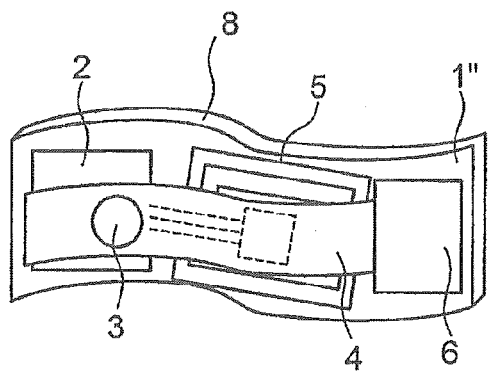
FIG. 24 is a diagram showing an application example of a thermoelectric conversion apparatus according to Example 8 of the present invention.

Referring to FIG. 24, an electronic device according to Example 8 of the present invention is a band-type health care sensor operable with body heat.

An electronic device as an example of applications of a thermoelectric conversion apparatus according to the present invention has a band 8 as a flexible support member detachably mounted on a human's arm as a heat source, a clinical thermometer 2, a pulsometer 3, and a blood pressure gauge 4 as signal generation devices (sensor devices in this example), a wireless transmission device 5, and a thermoelectric conversion device 1", which is a thermoelectric conversion apparatus according to the present invention. The clinical thermometer 2, the pulsometer 3, and the blood pressure gauge 4, the wireless transmission device 5, and the thermoelectric conversion device 1" are mounted on the band 8. The band 8 is provided with a hook and loop fastener 6 such as Magic Tape or Velcro (registered or unregistered trademarks). The health care sensor is detachably mounted with an adequate mounting force depending upon a diameter of a human's arm.

The thermoelectric conversion device 1" has substantially the same configuration as a thermoelectric conversion apparatus according to the present invention. Specifically, the thermoelectric conversion device 1" has a substrate and a power generation part. The power generation part includes a magnetic layer with magnetization and an electrode layer made of a material that exhibits the spin-orbit interaction and formed on the magnetic layer. The substrate and the power generation part have flexibility. The thermoelectric conversion device 1" further includes a flexible cover layer formed on the substrate so as to cover at least the power generation part.

The clinical thermometer 2, the pulsometer 3, and the blood pressure gauge 4 are sensor devices operable to output body temperature information, pulse number information, and blood pressure information as electric signals. The clinical thermometer 2 may be configured with use of a thermoelectric conversion apparatus according to the present invention.

The wireless transmission device 5 is connected to the clinical thermometer 2, the pulsometer 3, and the blood pressure gauge 4 via flexible wires formed by printing a pattern with a conductor. Furthermore, the wireless transmission device 5 has a flexible antenna formed by printing a pattern with a conductor. The wireless transmission device 5 temporarily stores electric signals from the clinical thermometer 2, the pulsometer 3, and the blood pressure gauge 4 as needed, performs an appropriate modulation on the electric signals, and then transmits the electric signals as radio wave signal from the antenna. The wireless transmission device 5 may be a device operable to perform radio transmission using a carrier medium such as an infrared ray, rather than radio waves. In an electronic device according to the present invention, not only a wireless signal transmitting circuit such as the wireless transmission device 5, but also a wireless signal receiving circuit may be provided. In such a case, two-way communication can be achieved with a host device.

The clinical thermometer 2, the pulsometer 3, the blood pressure gauge 4, and the wireless transmission device 5 need supply of electric power. Meanwhile, the electrode layer of the thermoelectric conversion device 1" is connected to portions of the clinical thermometer 2, the pulsometer 3, the blood pressure gauge 4, and the wireless transmission device 5 that are to receive electric power via flexible wires formed by printing a pattern with a conductor. Therefore, as a power supply to the clinical thermometer 2, the pulsometer 3, the blood pressure gauge 4, and the wireless transmission device 5, the thermoelectric conversion device 1" applies thermoelectric powers generated by using the temperature of a human's arm as a heat source.

When this health case sensor is wound around an arm, the thermoelectric conversion device 1" performs thermoelectric power generation based upon the body temperature. The generated electric power is used to operate the clinical thermometer 2, the pulsometer 3, the blood pressure gauge 4, and the wireless transmission device 5. An electronic device (host device) with a radio receiving device for health maintenance, which is not illustrated, receives and demodulates the body temperature information, the pulse number information, and the blood pressure information transmitted as radio wave signal. Thus, the electronic device acquires the body temperature information, the pulse number information, and the blood pressure information and conducts necessary information processing on the body temperature information, the pulse number information, and the blood pressure information.

The heat source is not limited to a human and may be an animal such a farm animal or a wild animal. Particularly, wild animals often have a wide area of activity. An electronic device according to the present invention, which does not need a power supply, is useful because it can be used at a place or in a situation in which it is difficult to ensure or replace a power supply.

INDUSTRIAL APPLICABILITY

The present invention is not limited to the aforementioned certain embodiments or examples. As a matter of course, in the present invention, various modifications may be made within the technical scope described in the claims.

Some or all of the aforementioned examples may be described in the following supplementary notes. Nevertheless, the present invention is not limited to those supplementary notes.

(Supplementary Note 1) A thermoelectric conversion apparatus comprising a substrate and a power generation part formed on the substrate for generating a thermoelectric power, wherein the power generation part comprises a magnetic layer with magnetization and an electrode layer made of a material exhibiting a spin-orbit interaction and formed on the magnetic layer, wherein the substrate and the power generation part have flexibility, respectively, wherein the thermoelectric conversion apparatus further comprises a cover layer having flexibility and formed on the substrate so as to cover at least the power generation part.

(Supplementary Note 2) A thermoelectric conversion apparatus of Supplementary Note 1, wherein a thickness of the cover layer is in a range of 60 to 150% of a thickness of the substrate.

(Supplementary Note 3) A thermoelectric conversion apparatus as recited of Supplementary Note 1 or 2, wherein the magnetic layer has coercivity (Supplementary Note 4) A thermoelectric conversion apparatus of any one of Supplementary Notes 1 to 3, wherein the magnetic layer includes a first magnetic layer formed on one of layer surfaces of the electrode layer and a second magnetic layer formed on the other layer surface of the electrode layer.

(Supplementary Note 5) A thermoelectric conversion apparatus of any one of Supplementary Notes 1 to 4, wherein a plurality of the power generation parts are stacked on the substrate.

(Supplementary Note 6) A thermoelectric conversion apparatus of Supplementary Note 5, further comprising a spacer layer made of a flexible material and formed between the power generation parts.

(Supplementary Note 7) A thermoelectric conversion apparatus of any one of Supplementary Notes 1 to 6, wherein the magnetic layer includes of magnetic layer pieces separated in a layer direction with a gap portion interposed therebetween.

(Supplementary Note 8) A thermoelectric conversion apparatus of Supplementary Note 7, wherein the thermoelectric conversion apparatus further comprises a stress absorption layer which is formed by flexible material embedded in the gap portion.

(Supplementary Note 9) A thermoelectric conversion apparatus according to any one of Supplemantary Notes 1 to 8, wherein the thermoelectric conversion apparatus further comprises a cylindrical member having a cylindrical shape, wherein the substrate, the power generation part and the cover layer are arranged outside of the cylindrical member so that a magnetization direction of the magnetic layer of the power generation part is aligned with an axial direction of the cylindrical member, wherein the cylindrical member allows a heat source or a cold source to flow or remain inside thereof.

(Supplementary Note 10) A thermoelectric conversion apparatus of Supplementary Note 9, wherein the substrate, the power generation part and the cover layer are wound with more than one turn in a circumferential direction of the cylindrical member.

(Supplementary Note 11) An electronic device comprising a flexible support member mounted on a heat source or a cold source, a signal generation device mounted on the support member, a wireless transmission device mounted on the support member, and the thermoelectric conversion apparatus according to any one of Supplemantary Notes 1 to 10, wherein the signal generation device generates electric signal, the wireless transmission device transmits, as wireless signal, the electric signal generated by the signal generation device, and the thermoelectric conversion apparatus applies the thermoelectric power as a power supply to one or both of the signal generation device and the wireless transmission device that need supply of electric power.

(Supplementary Note 12) A electronic device according to Supplemantary Note 11, wherein the thermoelectric conversion apparatus uses an animal as the heat source or the cold source, and wherein the signal generation device detects at least one of a body temperature, a pulse number, and a blood pressure of the animal, and generates electric signal representing the detection result.

(Supplementary Note 13) A electronic device of Supplementary Note 11 or 12, wherein the wireless transmission device is provided with an antenna, and transmits, as radio wave signal, the electric signal generated by the signal generation device.

(Supplementary Note 14) A thermoelectric conversion apparatus manufacturing method of manufacturing the thermoelectric conversion apparatus according to any one of Supplementary Notes 1 to 8, the method comprising the processes of forming sequentially the power generation part and the cover layer with rolling out a rolled film as the substrate; and then re-rolling up the film, wherein the power generation part forming process includes the steps of:

applying ink containing metal onto the film as the substrate or the magnetic layer by a printing method, and drying the ink to form the electrode layer; and supplying a fluid containing magnetic material onto the electrode layer or the film as the substrate by a metal organic deposition method, a sol-gel method or an aerosol deposition method, and drying the fluid to form the magnetic layer, and wherein the cover layer forming process includes the step of:

applying ink containing resin onto the film as the substrate so as to cover at least the power generation part by a printing method, and drying the ink to form the cover layer.

(Supplementary Note 15) A thermoelectric conversion apparatus manufacturing method of manufacturing the thermoelectric conversion apparatus according to Supplemantary Note 8, the method comprising the processes of forming sequentially the power generation part and the cover layer with rolling out a rolled film as the substrate; and then re-rolling up the film, wherein the power generation part forming process includes the steps of:

applying ink containing metal onto the film as the substrate or the magnetic layer by a printing method, and drying the ink to form the electrode layer; and supplying a fluid containing magnetic material onto the electrode layer or the film as the substrate by a metal organic deposition method, a sol-gel method or an aerosol deposition method, and drying the fluid to form the magnetic layer, wherein the magnetic layer forming step includes the steps of:

applying ink containing elastic material onto an area, where the stress absorption layer is to be formed, of the electrode layer or the film as the substrate by a printing method, and drying the ink to form the stress absorption layer; and supplying a fluid containing magnetic material onto an area, where the magnetic layer is to be formed while no stress absorption layer has been formed, of the electrode layer or the film as the substrate by a metal organic deposition method, a sol-gel method or an aerosol deposition method, and drying the fluid to form the plurality of magnetic layer pieces, and wherein the cover layer forming process includes the step of:

applying ink containing resin onto the film as the substrate so as to cover at least the power generation part by a printing method, and drying the ink to form the cover layer.

This application claims the benefit of priority from Japanese patent application No. 2011-129308, filed on Jun. 9, 2011, the disclosure of which is incorporated herein in its entirety by reference.

The invention claimed is:

1. A thermoelectric conversion apparatus, comprising:
a substrate; and
a power generation part formed on the substrate for generating a thermoelectric power,
wherein the power generation part comprises a first magnetic layer and a second magnetic layer and an electrode layer comprising a material exhibiting a spin-orbit interaction and formed on the magnetic layer,
wherein the substrate and the power generation part have flexibility, respectively,
wherein the thermoelectric conversion apparatus further comprises a cover layer having flexibility and formed on the substrate so as to cover at least the power generation part, and
wherein the a first magnetic layer is formed on one of front and back layer surfaces of the electrode layer and the second magnetic layer is formed on another of the front and the back layer surfaces of the electrode layer.

2. A thermoelectric conversion apparatus according to claim 1, wherein a thickness of the cover layer is in a range of 60% to 150% of a thickness of the substrate.

3. A thermoelectric conversion apparatus according to claim 1, wherein the first magnetic layer and the second magnetic layer have coercivity.

4. A thermoelectric conversion apparatus according to claim 1, wherein the first magnetic layer is disposed on said one of the front and the back layer surfaces of the electrode layer.

5. A thermoelectric conversion apparatus according to claim 4, wherein the second magnetic layer is disposed on said another of the front and the back layer surfaces of the electrode layer.

6. A thermoelectric conversion apparatus according to claim 1, wherein the first magnetic layer abuts said one of the front and the back layer surfaces of the electrode layer.

7. A thermoelectric conversion apparatus according to claim 6, wherein the second magnetic layer abuts said another of the front and the back layer surfaces of the electrode layer.

8. A thermoelectric conversion apparatus according to claim 1, wherein the first magnetic layer further abuts a surface of the substrate.

9. A thermoelectric conversion apparatus according to claim 8, wherein the second magnetic layer further abuts a surface of the cover layer.

* * * * *